(12) United States Patent
Hong

(10) Patent No.: US 6,775,148 B2
(45) Date of Patent: Aug. 10, 2004

(54) FUSE BOX

(76) Inventor: Yong-Qing Hong, 58, Ma Yuan West St., Taichung (TW)

( * ) Notice: Subject to any disclaimer, the term of this patent is extended or adjusted under 35 U.S.C. 154(b) by 63 days.

(21) Appl. No.: 10/307,078

(22) Filed: Nov. 26, 2002

(65) Prior Publication Data

US 2004/0100786 A1 May 27, 2004

(51) Int. Cl.[7] .................................................. H02H 5/04
(52) U.S. Cl. ....................................................... 361/752
(58) Field of Search ................................ 361/103, 104, 361/833, 834, 752, 647, 626; 337/241, 266; 324/133, 507, 550; 340/638, 639, 691.1, 693.5; 307/117, 126

(56) References Cited

U.S. PATENT DOCUMENTS 4,104,581 A * 8/1978 Arkosy ........................ 324/523
5,874,884 A * 2/1999 Hull et al. .................... 337/241
6,448,897 B1 * 9/2002 Ku ................................ 340/638

* cited by examiner

Primary Examiner—Phuong T. Vu

(57) ABSTRACT

A fuse box has a base seat, a plug fuse inserted in the base seat, a breakdown display electric circuit board disposed in the base seat, an upper cover engaging with the base seat, and a connection band connected to the base seat and the upper cover. A light emitting device is disposed on the base seat. The breakdown display electric circuit board has a positive end, a negative end, the plug fuse connected to the breakdown display electric circuit board, a first resistance connected to the plug fuse in parallel, a second resistance connected to the plug fuse in parallel, the second resistance connected to the first resistance in series, the light emitting device connected to the first resistance in parallel and connected to the second resistance in series, a load connected to the plug fuse and the second resistance, and the negative end connected to the load.

3 Claims, 5 Drawing Sheets

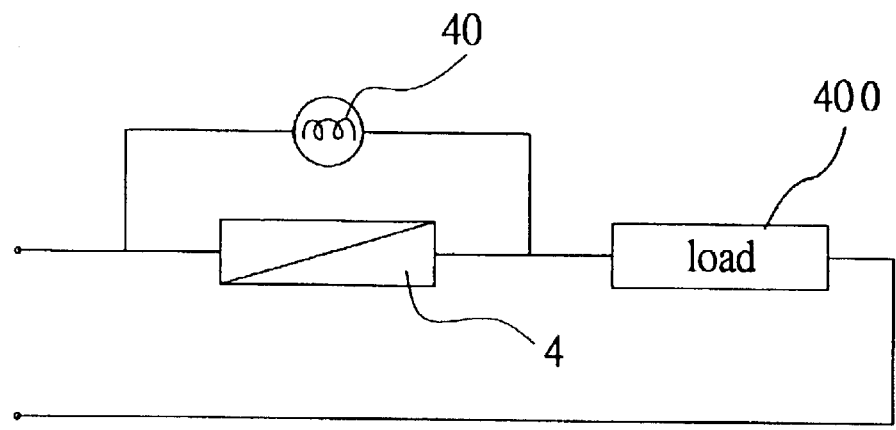
F I G. 5
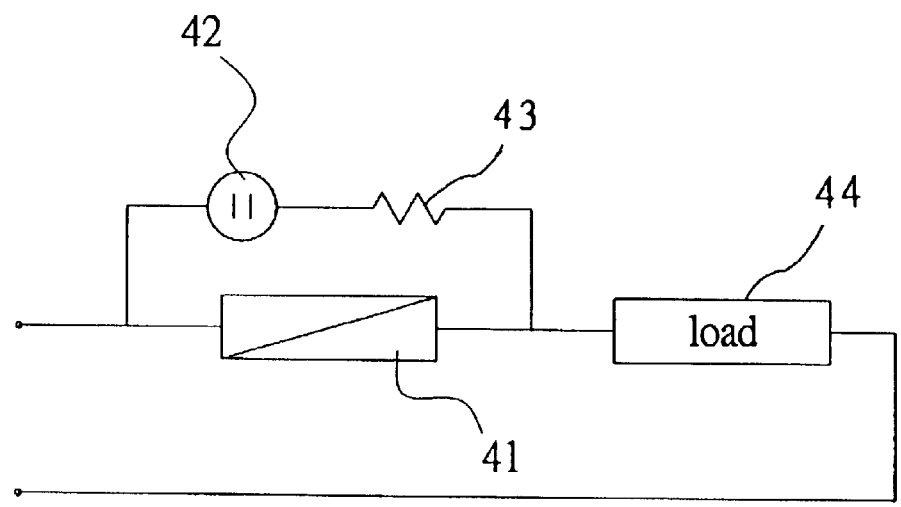
F I G. 6

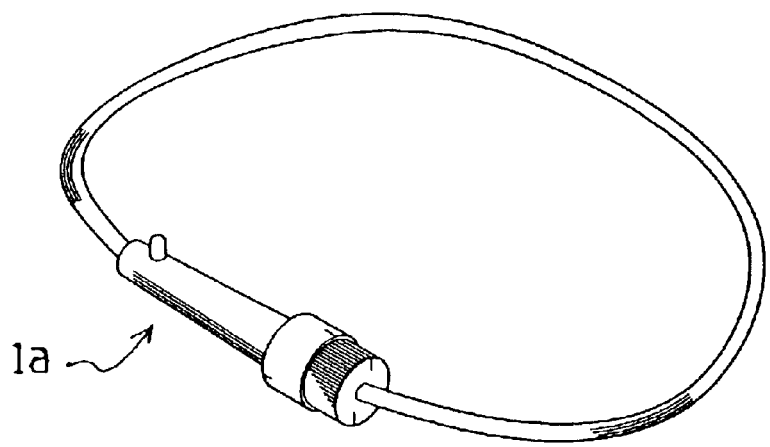
F I G. 7
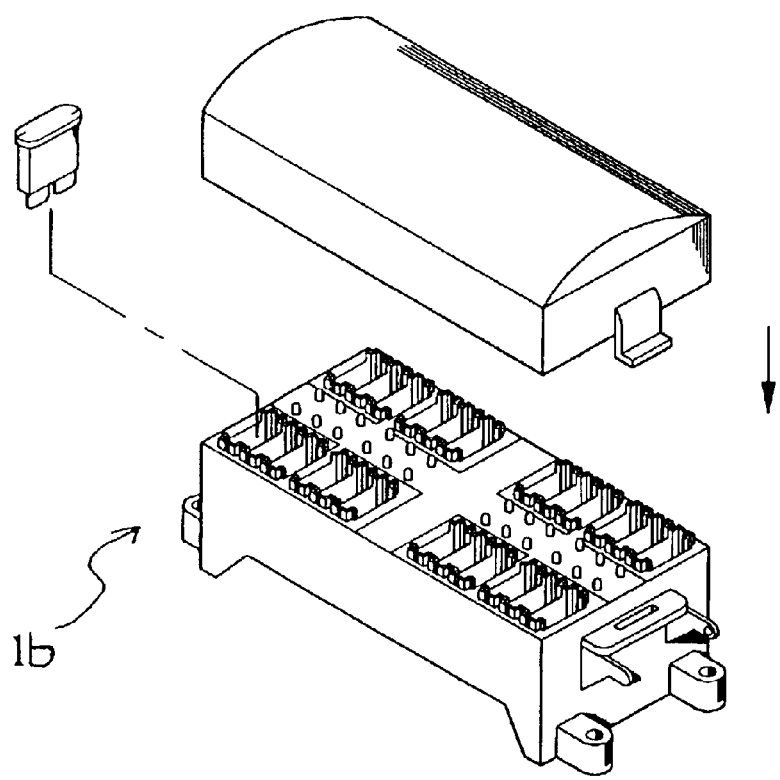
F I G. 8

FUSE BOX

BACKGROUND OF THE INVENTION

The present invention relates to a fuse box. More particularly, the present invention relates to a fuse box which has a light emitting device.

A conventional fuse box does not have a light emitting device to display a breakdown of a fuse. A plurality of fuses are disposed in a vehicle. If one of the fuses is blown, a worker should check all the fuses one by one.

SUMMARY OF THE INVENTION

An object of the present invention is to provide a fuse box which has a light emitting device to display a breakdown of a fuse.

Accordingly, a fuse box comprises a base seat, a plug fuse inserted in the base seat, a breakdown display electric circuit board disposed in the base seat, an upper cover engaging with the base seat, and a connection band connected to the base seat and the upper cover. A light emitting device is disposed on the base seat. The breakdown display electric circuit board has a positive end, a negative end, the plug fuse connected to the breakdown display electric circuit board, a first resistance connected to the plug fuse in parallel, a second resistance connected to the plug fuse in parallel, the second resistance connected to the first resistance in series, the light emitting device connected to the first resistance in parallel and connected to the second resistance in series, a load connected to the plug fuse and the second resistance, and the negative end connected to the load. A first wire is connected to the positive end of the breakdown display electric circuit board. A second wire is connected to the negative end of the breakdown display electric circuit board.

BRIEF DESCRIPTION OF THE DRAWINGS

FIG. 5 is an electric diagram showing a fuse connected to a direct current incandescent bulb;

FIG. 6 is an electric diagram showing a fuse connected to an alternating current neon bulb;

FIG. 7 is a perspective view of a cylinder-shaped fuse box of a preferred embodiment in accordance with the present invention; and FIG. 8 is a perspective view of a rectangular-shaped fuse box of a preferred embodiment in accordance with the present invention.

DETAILED DESCRIPTION OF THE INVENTION

Figure 1:
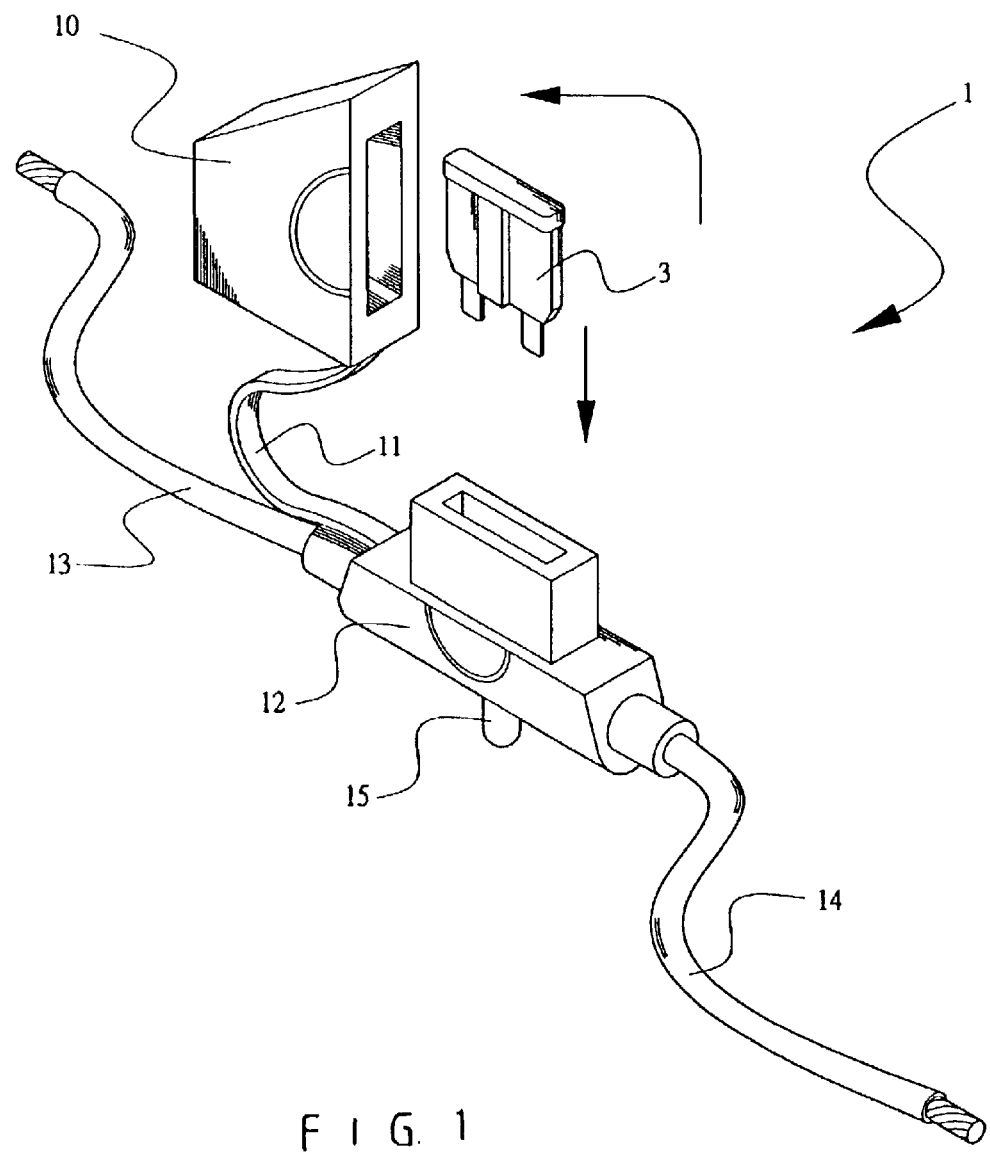
FIG. 1 is a perspective exploded view of a fuse box of a preferred embodiment in accordance with the present invention.
Figure 2:
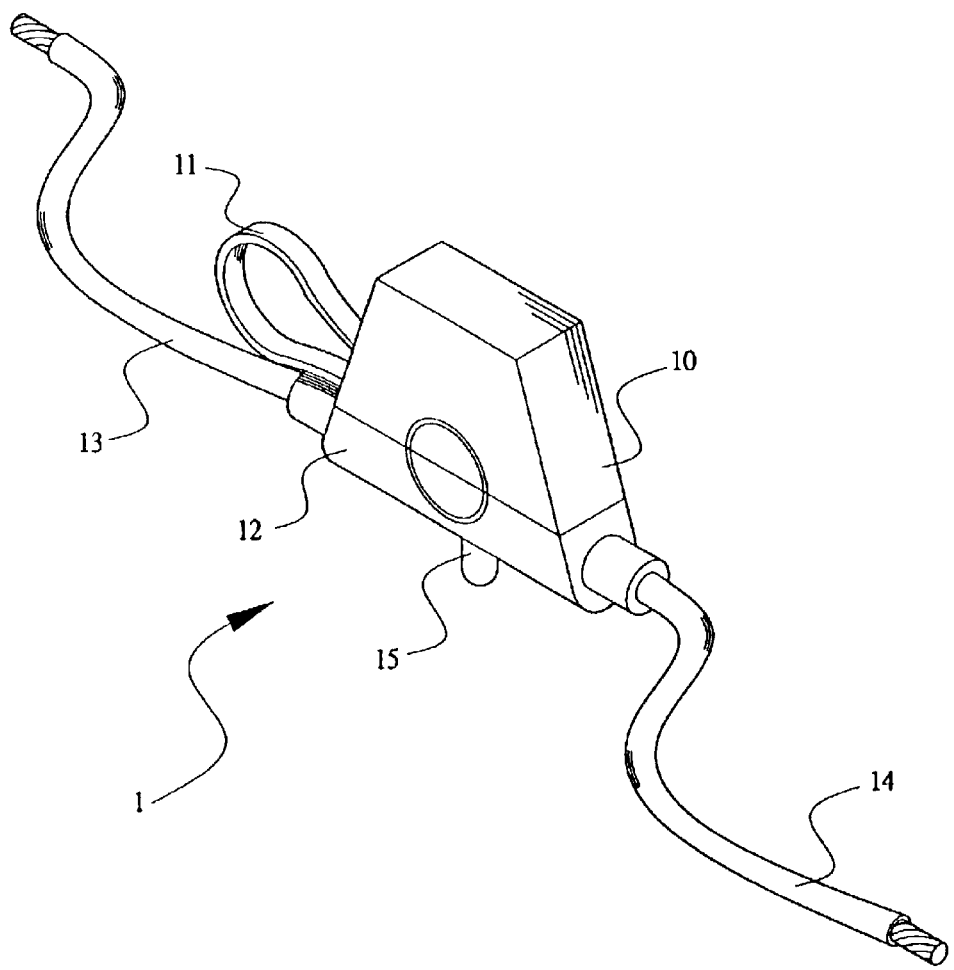
FIG. 2 is a perspective assembly view of a fuse box of a preferred embodiment in accordance with the present invention.
Figure 3:
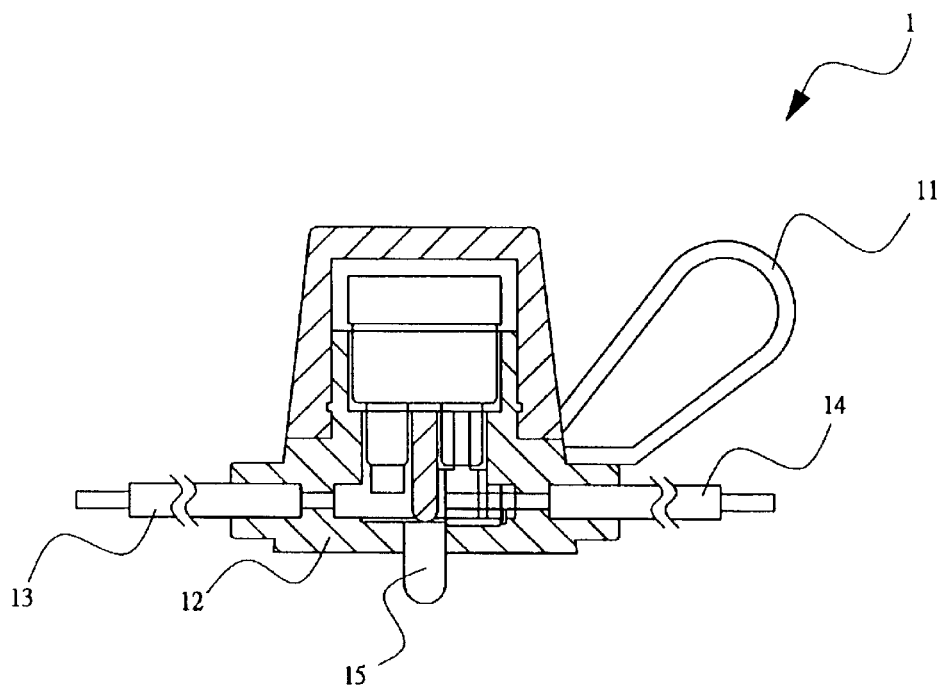
FIG. 3 is a sectional view of a fuse box of a preferred embodiment in accordance with the present invention.
Figure 4:
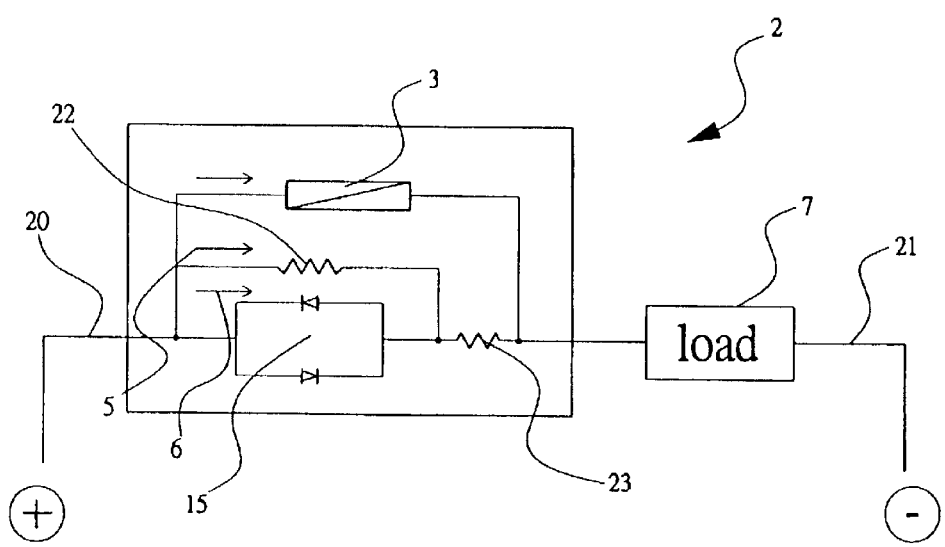
FIG. 4 is an electric diagram showing a breakdown display electric circuit board for a light emitting device.

Referring to FIGS. 1 to 4, a fuse box 1 comprises a base seat 12, a plug fuse 3 inserted in the base seat 12, a breakdown display electric circuit board 2 disposed in the base seat 12, an upper cover 10 engaging with the base seat 12, and a connection band 11 connected to the base seat 12 and the upper cover 10.

A light emitting device 15 is disposed on a bottom of the base seat 12.

The breakdown display electric circuit board 2 has a positive end 20, a negative end 21, the plug fuse 3 connected to the breakdown display electric circuit board 2, a first resistance 22 connected to the plug fuse 3 in parallel, a second resistance 23 connected to the plug fuse 3 in parallel, the second resistance 23 connected to the first resistance 22 in series, the light emitting device 15 connected to the first resistance 22 in parallel and connected to the second resistance 23 in series, a load 7 connected to the plug fuse 3 and the second resistance 23, and the negative end 21 connected to the load 7.

A first wire 13 is connected to the positive end 20 of the breakdown display electric circuit board 2.

A second wire 14 is connected to the negative end 21 of the breakdown display electric circuit board 2.

The light emitting device 15 has a pair of parallel light-emitting diodes positioned in opposite directions.

When the plug fuse 3 is blown, a current will flow through a first loop 5. Then the first resistance 22 and the second resistance 23 will decrease a voltage, and a minor current in a second loop 6 will enlighten the light emitting device 15.

Referring to FIG. 5, a fuse 4 is connected to a direct current incandescent bulb 40 and a load 400.

Referring to FIG. 6, a fuse 41 is connected to an alternating current neon bulb 42 and a resistor 43 in parallel and connected to a load 44 in series.

Referring to FIG. 7, a second fuse box 1a is in a cylinder shape.

Referring to FIG. 8, a third fuse box 1b is in a rectangular shape.

The invention has the following advantage.

When the fuse is blown, the light emitting device will display a breakdown of the fuse.

The invention is not limited to the above embodiment but various modification thereof may be made. Further, various changes in form and detail may be made without departing from the scope of the invention.

I claim:

1. A fuse box comprises:
   a base seat, a plug fuse inserted in the base seat, a breakdown display electric circuit board disposed in the base seat, an upper cover engaging with the base seat, and a connection band connected to the base seat and the upper cover,
   a light emitting device disposed on the base seat,
   the breakdown display electric circuit board having a positive end, a negative end, the plug fuse connected to the breakdown display electric circuit board, a first resistance connected to the plug fuse in parallel, a second resistance connected to the plug fuse in parallel, the second resistance connected to the first resistance in series, the light emitting device connected to the first resistance in parallel and connected to the second resistance in series, a load connected to the plug fuse and the second resistance, and the negative end connected to the load,
   a first wire connected to the positive end of the breakdown display electric circuit board, and
   a second wire connected to the negative end of the breakdown display electric circuit board.

2. The fuse box as claimed in claim 1, wherein the light emitting device is disposed on a bottom of the base seat.

3. The fuse box as claimed in claim 2, wherein the light emitting device has a pair of parallel light-emitting diodes positioned in opposite directions.

* * * * *